(12) United States Patent
Kodaira et al.

(10) Patent No.: US 6,594,186 B2
(45) Date of Patent: Jul. 15, 2003

(54) SEMICONDUCTOR MEMORY AND BURN-IN METHOD FOR THE SAME

(75) Inventors: Satoru Kodaira, Chino (JP); Masaya Uehara, Chino (JP); Hitoshi Kobayashi, Nagano-ken (JP); Takeshi Kumagai, Chino (JP)

(73) Assignee: Saiko Epson Corporation, Tokyo (JP)

( * ) Notice: Subject to any disclaimer, the term of this patent is extended or adjusted under 35 U.S.C. 154(b) by 0 days.

(21) Appl. No.: 10/171,421

(22) Filed: Jun. 12, 2002

(65) Prior Publication Data

US 2003/0007413 A1 Jan. 9, 2003

(30) Foreign Application Priority Data

Jun. 13, 2001 (JP) ........................................ 2001-178556

(51) Int. Cl.[7] ............................. G11C 29/00; G11C 7/00; G11C 8/00
(52) U.S. Cl. .................... 365/201; 365/236; 365/233; 365/195; 714/718
(58) Field of Search ................................. 365/201, 236, 365/233, 195; 714/718

(56) References Cited

U.S. PATENT DOCUMENTS 6,038,181 A * 3/2000 Braceras et al. ............ 365/201
6,157,201 A * 12/2000 Leung, Jr. .................... 324/760
6,349,065 B1 * 2/2002 Ooishi .......................... 365/201
6,414,890 B2 * 7/2002 Arimoto et al. ............. 365/201

FOREIGN PATENT DOCUMENTS

JP    10-172298    6/1998

* cited by examiner

Primary Examiner—Richard Elms
Assistant Examiner—Nam Nguyen
(74) Attorney, Agent, or Firm—Hogan & Hartson, LLP

(57) ABSTRACT

A semiconductor memory having a plurality of memory cells includes a first terminal that becomes a power supply terminal for the semiconductor memory, a second terminal that becomes a ground terminal for the semiconductor memory, a third terminal for inputting a burn-in mode signal to place the semiconductor memory in a burn-in mode and a fourth terminal for inputting an external clock signal. The semiconductor memory further includes an address signal generation section that generates an address signal for selecting each of the plurality of memory cells based on counting of the clock signal while the burn-in mode signal is input. A data signal generation section generates a data signal based on the clock signal while the burn-in mode signal is input. A data writing section writes data of the data signal in the memory cells selected by the address signal.

63 Claims, 11 Drawing Sheets

SEMICONDUCTOR MEMORY AND BURN-IN METHOD FOR THE SAME

BACKGROUND OF THE INVENTION

1. Field of the Invention

The present invention relates to a semiconductor memory, and more particularly to a semiconductor memory using a burn-in method.

2. Related Art

Failures in semiconductor memories such as static random access memories (SRAM)s are classified into initial failures, accidental failures and wear failures. The initial failures are those that are caused by defects and deficiencies. The accidental failures are determined by the reliability characteristic to the semiconductor memories and the wear failures are caused by the service life of the semiconductor memories.

A burn-in step is conducted to remove the initial failures among these failures. The burn-in is a test that gives accelerated stresses on semiconductor memories by operating the semiconductor memories with temperatures and voltages that are higher than the normal operating conditions, to thereby remove in a short time defective products having initial failures. The initial failures occur at a higher rate than those of the other failures. Accordingly, by removing semiconductor memories that may have initial failures by the burn-in step, the reliability of semiconductor memories is improved.

Conventionally, the burn-in step is conducted after the semiconductor memory has been assembled into a final shipping configuration such as a molded package, which would waste the assembly costs for chips that are found defective by the burn-in test. As such, there are high demands in conducting the burn-in step when the semiconductor memory is in its wafer state.

In a normal wafer-level burn-in stop, probe needles are brought in contact with address terminals, data input (input/output) terminals and control terminals of semiconductor memories, and a voltage stress is applied to each of the memory cells. In this step, a special burn-in apparatus is often used such that the operation is conducted under a temperature condition higher than an operation temperature range specified by the semiconductor memory, and the stresses can be simultaneously applied to many chips in one probe contact. In this case, since the probes for the burn-in test are provided in addition to the probes for the normal wafer test, the frequency in which the probe needles are brought in contact with the respective terminals increases, which damages the terminals, and results in a lower yield.

It is an advantage of the present invention to provide semiconductor memories and a burn-in method for the same, which prevents the yield from lowering due to damages on address terminals and data input (input/output) terminals caused by probe needles particularly in a wafer-level burn-in test, and shortens the time required for the burn-in test.

SUMMARY OF THE INVENTION

In accordance with one embodiment of present invention, a semiconductor memory having a plurality of memory cells includes a first terminal that becomes a power supply terminal for the semiconductor memory, a second terminal that becomes a ground terminal for the semiconductor memory, a third terminal for inputting a burn-in mode signal burn-in mode signal to place the semiconductor memory in a burn-in mode and a fourth terminal for inputting an external clock signals. The semiconductor memory further includes an address signal generation section that generates an address signal for selecting each of the plurality of memory cells based on counting of the clock signal while the burn-in mode signal is input. A data signal generation section generates a data signal based on the clock signal while the burn-in mode signal is input. A data writing section writes data of the data signal in the memory cells selected by the address signal.

In accordance with the embodiment of the present invention, an address signal for selecting each of the plurality of memory cells is generated based on the counting of an external clock signal, a data signal is generated based on the external clock signal, and data are written in the memory cells. Therefore, the burn-in test does not require address terminals, data input (input/output) terminals, and control terminals that are used for the normal operation, such that the address terminals, data input (input/output) terminals, control terminals can be prevented from damages. Accordingly, the embodiment of the present invention can improve the yield in manufacturing semiconductor memories.

Also, in accordance with the embodiment of the present invention, terminals used for burn-in are only the first through fourth terminals, which makes it possible to increase the number of chips that can be burnt in at once, in view of the fact that the number of terminals of a burn-in apparatus is limited. As a result, the burn-in time for each wafer can be shortened.

Also, in accordance with the embodiment of the present invention, an address signal for selecting each of the plurality of memory cells is generated based on the counting of the clock signal, in other words, addresses are generated in series, which makes it unnecessary to use a complex address signal generation circuit.

Examples of the address signal generation section, the display signal generation section, and the data writing section are described below in the section Burn-in Mode illustrating embodiments of the present invention. It is noted that the power supply terminal is, for example, a VDD terminal, and the ground terminal is, for example, a VSS terminal.

In accordance with another embodiment of the present invention, the first terminal, the second terminal, the third terminal and the fourth terminal may be exclusively used for the burn-in mode, and the embodiment may further include a fifth terminal that is different from the first terminal and becomes a power supply terminal for the semiconductor memory, and a sixth terminal that is different from the second terminal and becomes a ground terminal for the semiconductor memory.

In the structure described above, since the first terminal, the second terminal, the third terminal and the fourth terminal may be exclusively used for burn-in, the use of the semiconductor memory is not affected even when these terminals are damaged due to contacts of the probe needles in a burn-in test.

In accordance with the above embodiment of the present invention, the address signal generation section may include a counter, wherein an output from the counter may be used as the address signal.

In accordance with another embodiment of the present invention, the data signal generation section may be equipped with a signal divider that divides an output signal from a flip-flop at the last stage of the counter, and may generate the data signal based on a signal output from the signal divider.

By so doing, a first level is written in the plurality of memory cells first and then a second level can be written therein. Accordingly, a stress at the first level and a stress at the second level can be applied to each of the memory cells, which makes it possible to apply efficient stresses to each of the memory cells. For the first level and the second level, the following two cases may apply. For example, the first level is a H level, and the second level is a L level. Conversely, the first level is a L level, and the second level is a H level. It is noted that an example of the signal divider will be described below in the section Burn-in Mode illustrating embodiments of the present invention.

The embodiment of the present invention may further be equipped with a device that releases a function to terminate a selection period for a word line and a bit line pair earlier than a cycle time, based on the burn-in mode signal.

By so doing, the selected memory cells can be placed under stresses for a longer time compared to the case where they are normally operated. As a result, the time for burn-in can be shortened. It is noted that the function to terminate the selection period for a word line and a bit line pair earlier than the cycle time is one of the functions to lower the power consumption, for example, an automatic power-down function. One example of this device is described below in the section Release of Automatic Power-down illustrating embodiments of the present invention.

The embodiment of the present invention may be further equipped with an address signal input circuit at which an external address signal is input, and a data signal input circuit at which an external data signal is input. The address signal input circuit may prohibit input of the external address signal by the burn-in mode signal, and the data signal input circuit may prohibit input of the external data signal by the burn-in mode signal.

By the structure described above, the burn-in is conducted while inputs of the address signal and data signal from outside are prohibited. As a result, even when the input terminals are open, a through current is prevented from flowing through the input circuit.

In accordance with another embodiment of the present invention a burn-in method for a semiconductor memory having a plurality of memory calls includes placing the semiconductor memory in a burn-in mode, supplying a potential to the semiconductor memory, generating an address for each of the plurality of memory cells based on counting of an external clock signal during the burn-in mode, generating data based on the clock signal during the burn-in mode, and writing the data in the memory cells corresponding to the addresses.

In accordance with the other embodiments of the present invention, a semiconductor memory practices the steps recited above.

In accordance with the other embodiments of the present invention, the writing data may be conducted while releasing a function to terminate a selection period for a word line and a bit line pair earlier than a cycle time.

As a result, the present invention may further be equipped with a device that releases a function to terminate a selection period for a word line and a bit line pair earlier than a cycle time, based on the burn-in mode signal.

In accordance with the other embodiments of the present invention, the writing of data writes a first level in the plurality of memory cells, and then writes a second level therein.

As a result, the data signal generation section may be equipped with a signal divider that divides an output signal from a flip-flop at the last stage of the counter, and may generate the data signal based on a signal output from the signal divider The other embodiments of the present invention prohibit input of external address and data during the burn-in mode.

As a result, the present invention may be further equipped with an address signal input circuit at which an external address signal is input, and a data signal input circuit at which an external data signal is input. The address signal input circuit may prohibit input of the external address signal by the burn-in mode signal, and the data signal input circuit may prohibit input of the external data signal by the burn-in mode signal.

In accordance with the other embodiments of the present invention, the burn-in may be conducted at a wafer-level.

Since the number of terminals that are brought in contact with probe needles in a burn-in step can be reduced, the number of chips that can be subject to a burn-in step at once can be increased, when the burn-in is conducted at a wafer-level.

DETAILED DESCRIPTION OF THE PREFERRED EMBODIMENTS

A preferred embodiment of the present invention will be described below with reference to the accompanying drawings. In the embodiment, a semiconductor memory in accordance with the present invention is applied here to an SRAM chip. However, the present invention is not limited to this embodiment, but is also applicable to other semiconductor memories.

Function Block of SRAM Chip

Figure 2:
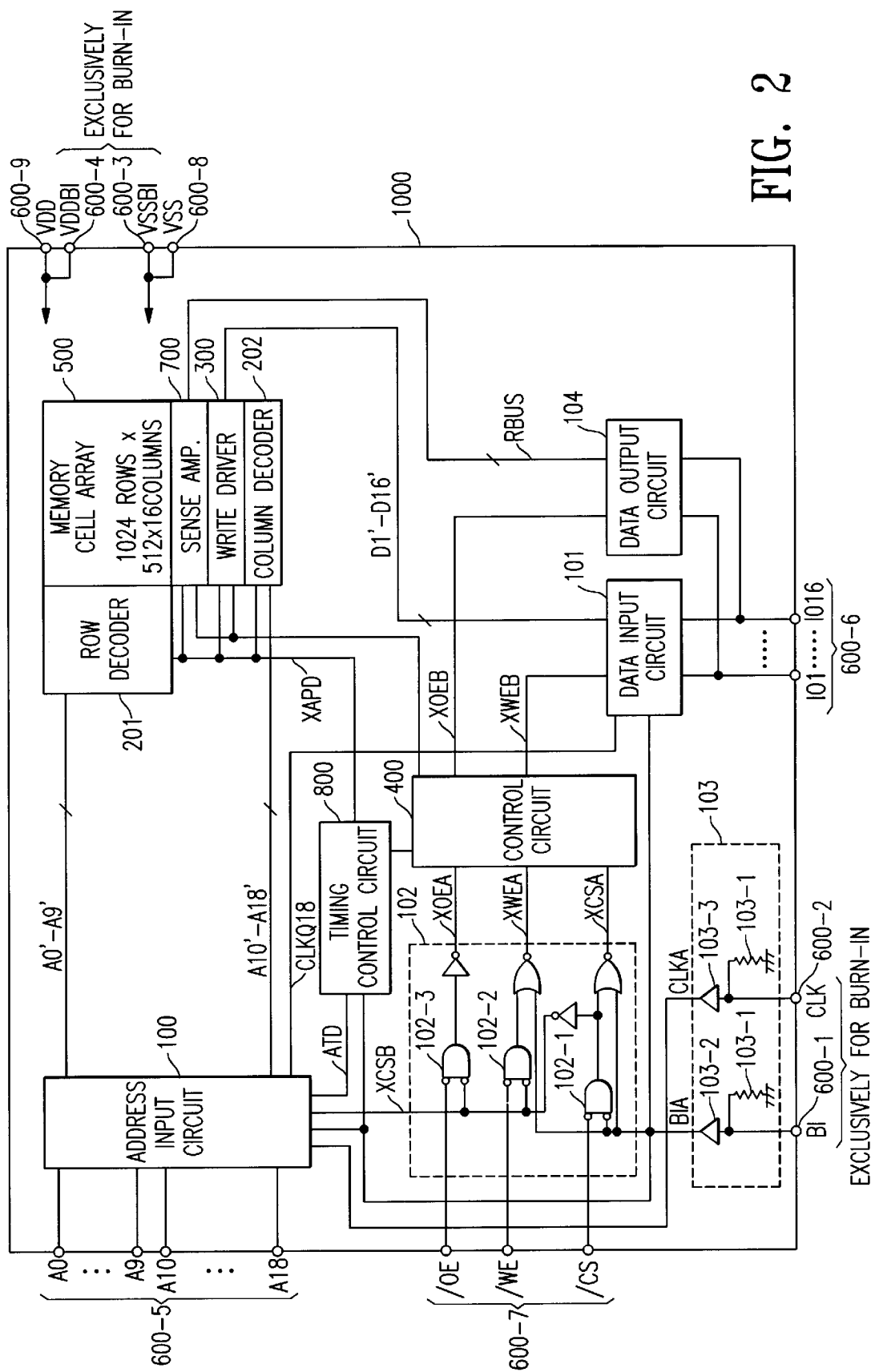
FIG. 2 shows a block diagram of the SRAM chip in accordance with an embodiment of the present invention.

FIG. 2 schematically shows a block diagram of an SRAM chip 1000 in accordance with one embodiment of the present invention. Referring to FIG. 2, main function blocks of the SRAM chip in accordance with the embodiment of the present invention will be described.

The SRAM chip 1000 includes an address input circuit 100, a data input circuit 101, a control signal input circuit 102, a burn-in control signal input circuit 103, a data output circuit 104, a row decoder 201, a column decoder 202, a write driver 300, a control circuit 400, a memory cell array 500, a sense amplifier 700, a timing control circuit 800, and numerous terminals 600-1 through 600-9.

The memory cell array 500 is formed with 8-megabit memory cells that are composed of 524,288 words×16 bits.

The terminals 600-1 through 600-9 are in the form of metal pads, and will be connected to external terminals of a package through bumps and bonding wires in a package assembly step. The terminals include terminals that are used during the normal operation of the SRAM chip 1000, and burn-in specific terminals that are used only during a burn-in mode.

The terminals that are used during the normal operation are address input terminals 600-5 at which address signals A0–A18 are input, data input/output terminals 600-6 at which IO1–IO16 are input and output, a group of terminals 600-7 for control signals, a VSS ground terminal 600-8, and a VDD power supply terminal 600-9. A chip select signal is input in one of the groups of terminals 600-7, a /CS terminal, a write enable signal is input in a /WE terminal, and an output enable signal is input in a /OE terminal. It is noted that the /CS, /WE and /OE signals are active low.

The burn-in specific terminals include a BI terminal 600-1 at which a burn-in mode signal for placing the SRAM chip 1000 in a burn-in mode, a CLK terminal 600-2 at which a clock signal from outside is input during a burn-in mode, a VDDBI terminal 600-4 that functions as a VDD power supply terminal during a burn-in mode, and a VSSBI terminal 600-3 that functions as a VSS ground terminal during a burn-in mode. The BI terminal and CLK terminal are both pulled down to a ground potential VSS by resistance elements 103-1, respectively, and signals input to these terminals are converted to internal signals BIA and CLKA by input buffers 103-2 and 103-3, respectively. When the BI terminal is at an H level, the SRAM chip 1000 is placed in a burn-in mode, and when it is open or at an L level, the SRAM chip is placed in a normal operation mode. The VDDBI terminal 600-4 is connected to the VDD terminal 600-9, and the VSSBI terminal 600-3 is connected to the VSS terminal 600-8 within the chip.

Address signed A0–A18 are input in the address input circuit 100, and signals A0'–A18' are sent to the row decoder 201 and the column decoder 202, such that the memory cells in the memory cell array 500 are selected.

Signals input in the control input terminals 600-7 composed of the /CS, /WE and /OE terminals are input in the control signal input circuit 102, then transferred to the control circuit 400, and generate control signals for operations such as writing and reading data in the SRAM chip 1000.

External data signals are input through the data input/output terminals 600-6 during a data writing operation to the data input circuit 101, which sends signals D1'–D16' to the write driver 300, whereby data is written in selected memory cells.

Signals that are generated by amplifying data of the memory cells during a data reading operation are input to the data output circuit 104 through a read bus (RBUS), and then output externally through the data input/output terminals 600-6.

Memory Cell

Figure 3:
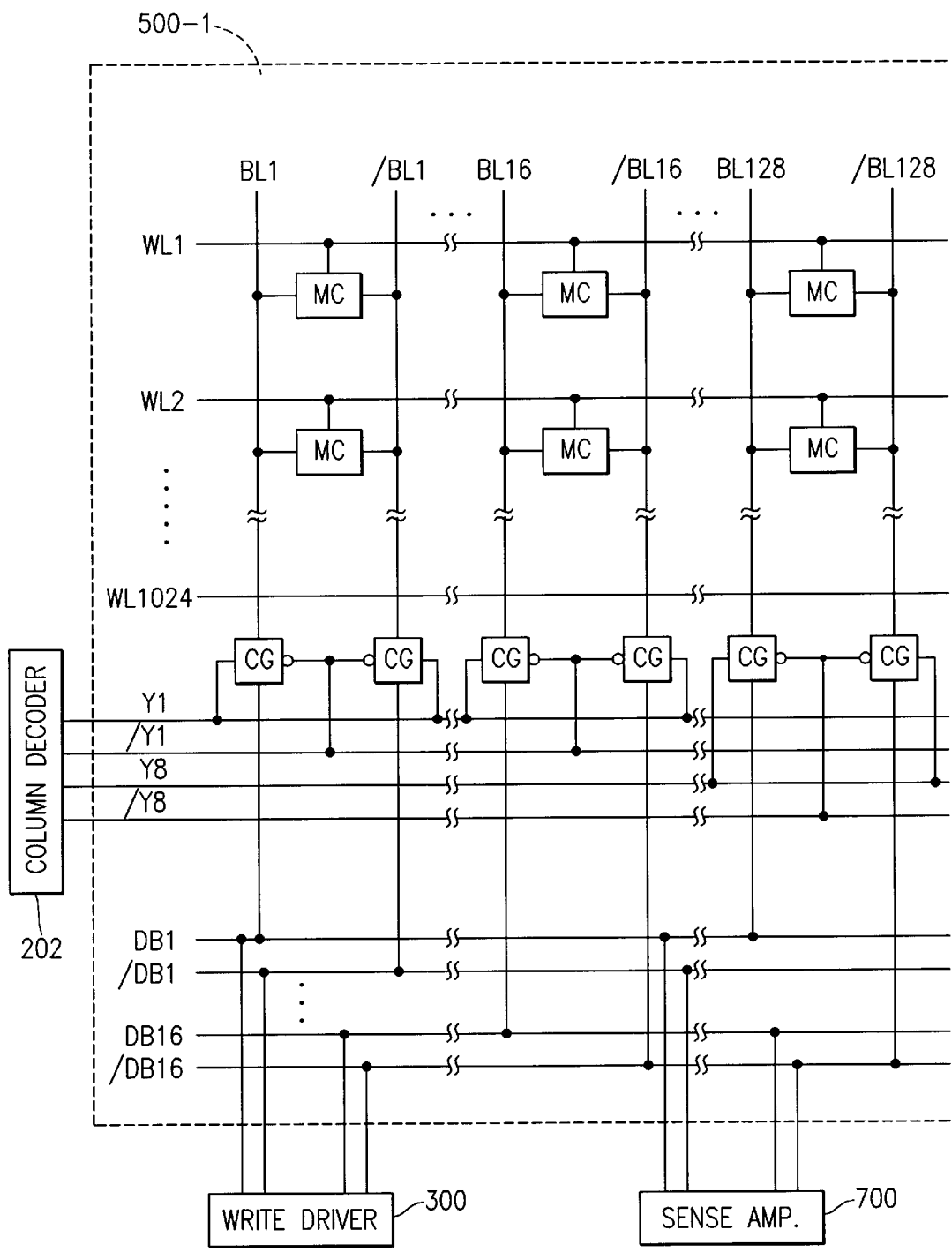
FIG. 3 shows a block diagram of a memory cell array in accordance with an embodiment of the present invention.
Figure 4:
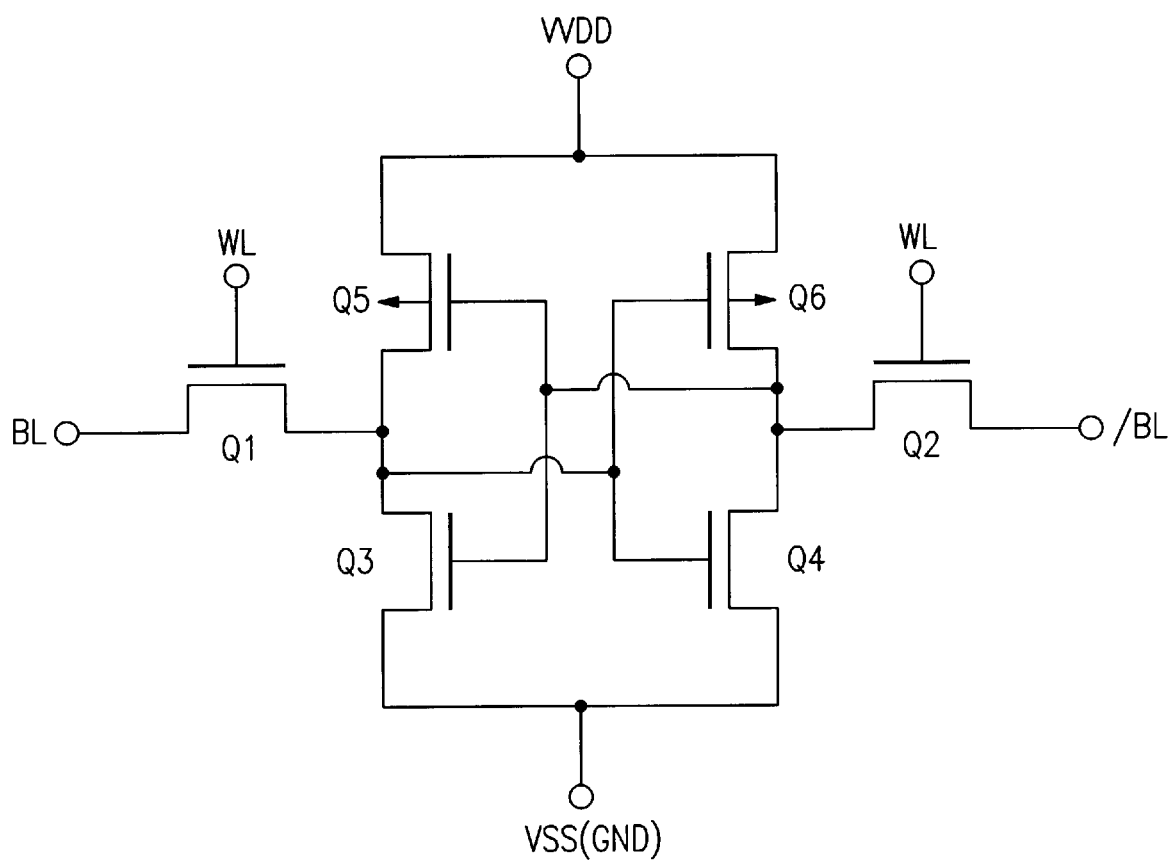
FIG. 4 is an equivalent circuit diagram of a memory cell MC in accordance with an embodiment of the present invention.

Referring to FIG. 3, the memory cell array 500 of the SRAM chip 1000 in accordance with the present embodiment is described. FIG. 3 schematically shows a memory block composed of 128 k bits of memory cells. 64 memory blocks are disposed in the memory cell array 500 shown in FIG. 2 to provide a capacity of 8 megabits. A memory block 500-1 contains 128 k pieces of memory cells MC disposed in an array. As shown in FIG. 4, a memory cell MC is composed of six transistors, i.e., transfer transistors Q1 and Q2, driver transistors Q3 and Q4, and load transistors Q5 and Q6. The memory block 500-1 is equipped with a plurality of word lines WL1–WL1024, a plurality of bit line pairs (BL1, /BL1)–(BL128, /BL128) crossing these word lines, and the memory cells MC provided at intersections of the word lines and the bit line pairs.

Data bus pairs (DB1, /DB1)–(DB16, /DB16) are connected to the bit line pairs by each 16 of the bit line pairs, respectively. For example, in the case of the data bus pair (DB1, /DB1), the data bus pair (DB1, /DB1) is connected to the bit line pairs (BL1, /BL1), (BL17, /BL17), (BL33, /BL33), . . . , and (BL113, /BL113) through column gates CG that are composed of transmission gates. The data bus pairs (DB1, DB1)–(DB16, /DB16) are connected to the write driver 300 and the sense amplifier 700.

The column decoder 202 outputs 8 pairs of decode signals (Y1, /Y1)–(Y8, /Y8) to control the column gates CG to thereby control the bit line pairs and the data bus pairs.

Input Circuit

Figure 1:
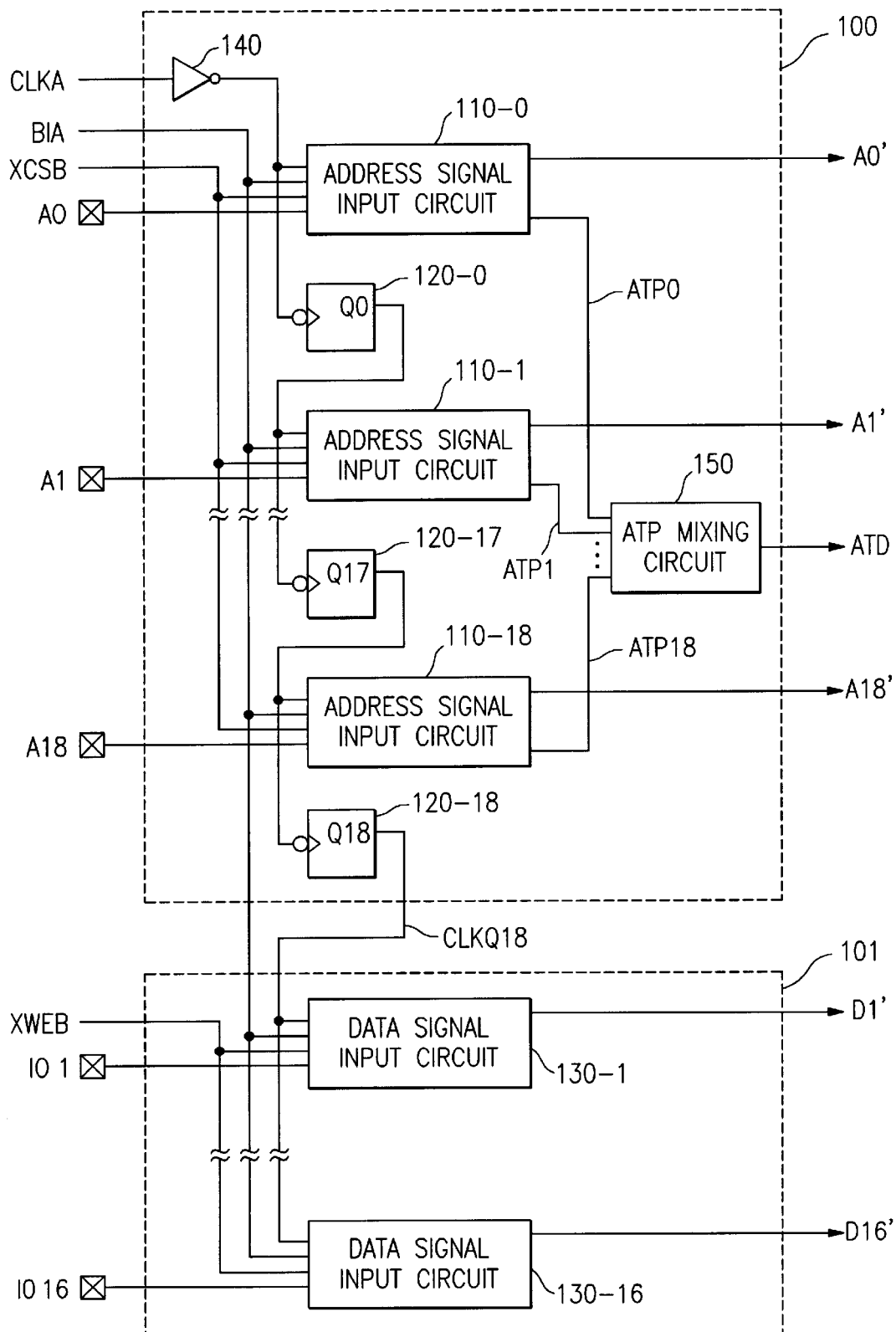
FIG. 1 shows a block diagram of an address input circuit of a SRAM chip in accordance with an embodiment of the present invention.

Referring to FIGS. 1 and 2, the address input circuit 100 and the data input circuit 101 of the SRAM chip in accordance with the present embodiment will be described. FIG. 1 shows a block diagram of the address input circuit 100 and the data input circuit 101. The address input circuit 100 includes nineteen address signal input circuits 110-0–110-18, nineteen T flip-flops 120-0–120-18, and an ATP mixing circuit 150 that mixes address transfer detection signals ATP0–ATP18. The data input circuit 101 includes sixteen data signal input circuits 130-1–130-16.

The address signal input circuits 110-0–110-18 are connected to a XCSB signal and a BIA signal, and also to the corresponding terminals A0–A18 respectively. The data signal input circuits 130-1–130-16 are connected to a XWEB signal and the BIA signal, and also connected to the corresponding terminals IO1–IO15, respectively. Eighteen of the T flip-flops 120-0–120-17 form a counter, in other words a counter composed of eighteen stages of T flip-flops.

A CLKA signal is connected to the address signal input circuit 110-0 and a clock input terminal of the first stage of the T flip-flops (120-0) through an inverter 140. An output terminal Q0 of the first stage of the T flip-flops (120-0) is connected to the address signal input circuit 110-1 and a clock terminal of the second stage of the T flip-flops (not shown). The succeeding T flip-flops and address signal input circuits are connected in a similar manner. Then, an output terminal Q17 of the eighteenth stage of the T flip-flops (120-17) is connected to the address signal input circuit 110-18 and also a clock input terminal of the T flip-flop 120-18. An output terminal Q18 of the T flip-flop 120-18 is connected to the data signal input circuits 130-1–130-16.

Figure 5:
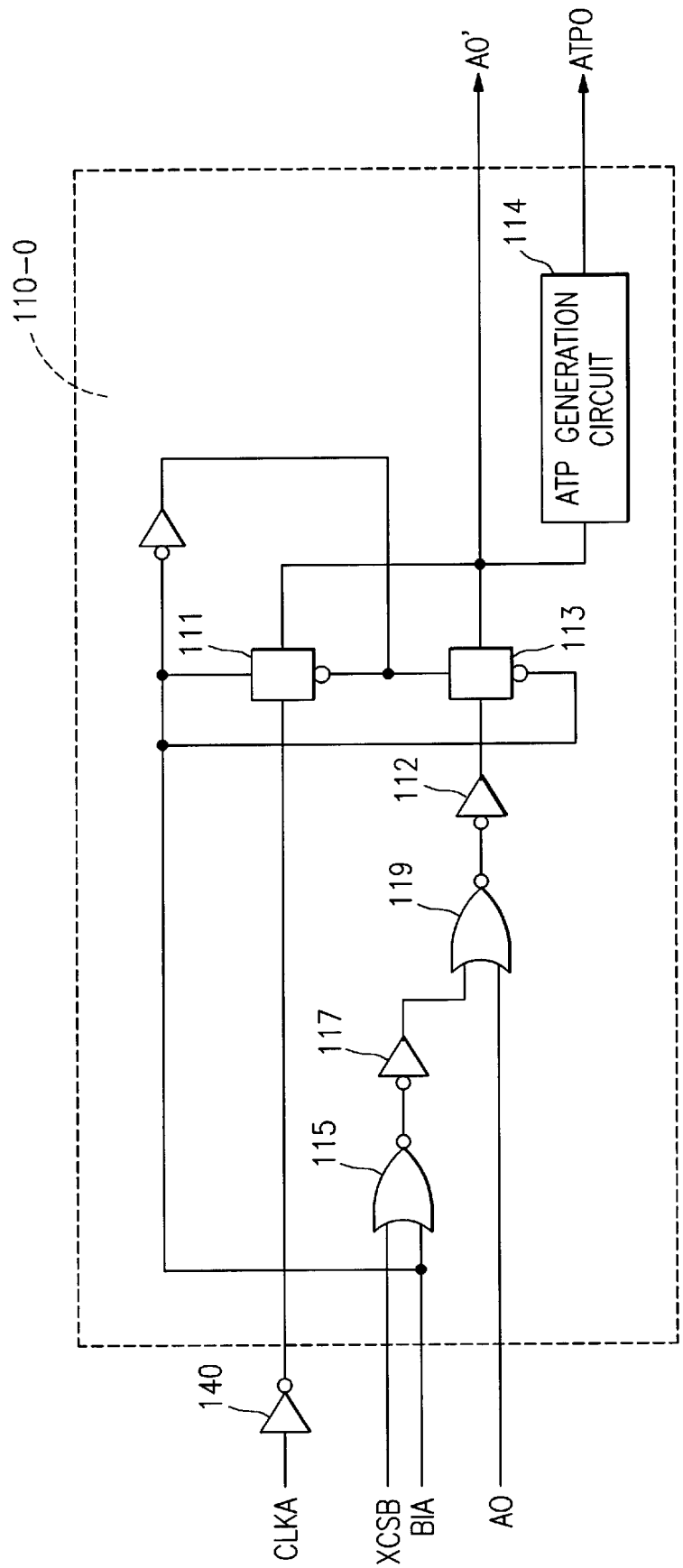
FIG. 5 shows a circuit diagram of an address signal input circuit of the SRAM chip in accordance with an embodiment of the present invention.

The address signal input circuits will be described in detail, using the address signal input circuit 110-0 as an example. FIG. 5 shows a circuit diagram of the address signal input circuit 110-0. During the normal operation, since the /chip select signal (/CS) is an L level (active), and the burn-in mode signal (BI) is at an L level (non-active), the XCSB signal becomes an L level, and the BIA signal becomes an L level. A signal at an H level output from a NOR gate 115 is inverted by an inverter 117 to become a signal at an L level, and then input in a NOR gate 119. Also, by the BIA signal at an L level, a transfer gate 113 is turned ON. Accordingly, an external address signal input through the terminal A0 is inverted by the NOR gate 119, inverted by the inverter 112, transferred through the transfer gate 113, and output as an address A0' signal to the row decoder 201. The address A0' signal is connected to the ATP generation circuit 114, which generates a pulse signal ATPO when the address A0' signal shifts from H level to L level or L level to H level.

On the other hand, during a burn-in mode, the burn-in mode signal becomes an H level (active), and the clock signal CLKA is input through the inverter 140 in the address input circuit 110-0. The BIA signal at an H level turns ON a transfer gate 111. By this, a clock signal that is inverted by the inverter 140 is passed through the transfer gate 111, and output as an address A0' signal to the row decoder 201. By the BIA signal at an H level, the transfer gate 113 turns OFF, such that an input through the terminal A0 is prohibited. Also, by the BIA signal at an H level, a signal at an L level that is output from the NOR gate 115 is inverted by the inverter 117, and input in the NOR gate 119. As a result, the current that flows to the NOR gate 119 is shut out.

The above is a detail of the address signal input circuit 110-0. The address signal input circuits 110-1–110-18 each have a structure similar to that of the address signal input circuit 110-0. However, it is noted that, instead of the clock signal input through the inverter 140, signals to be provided are those provided from the output terminals Q0–Q17 of the T flip-flops 120-0–120-17.

Figure 6:
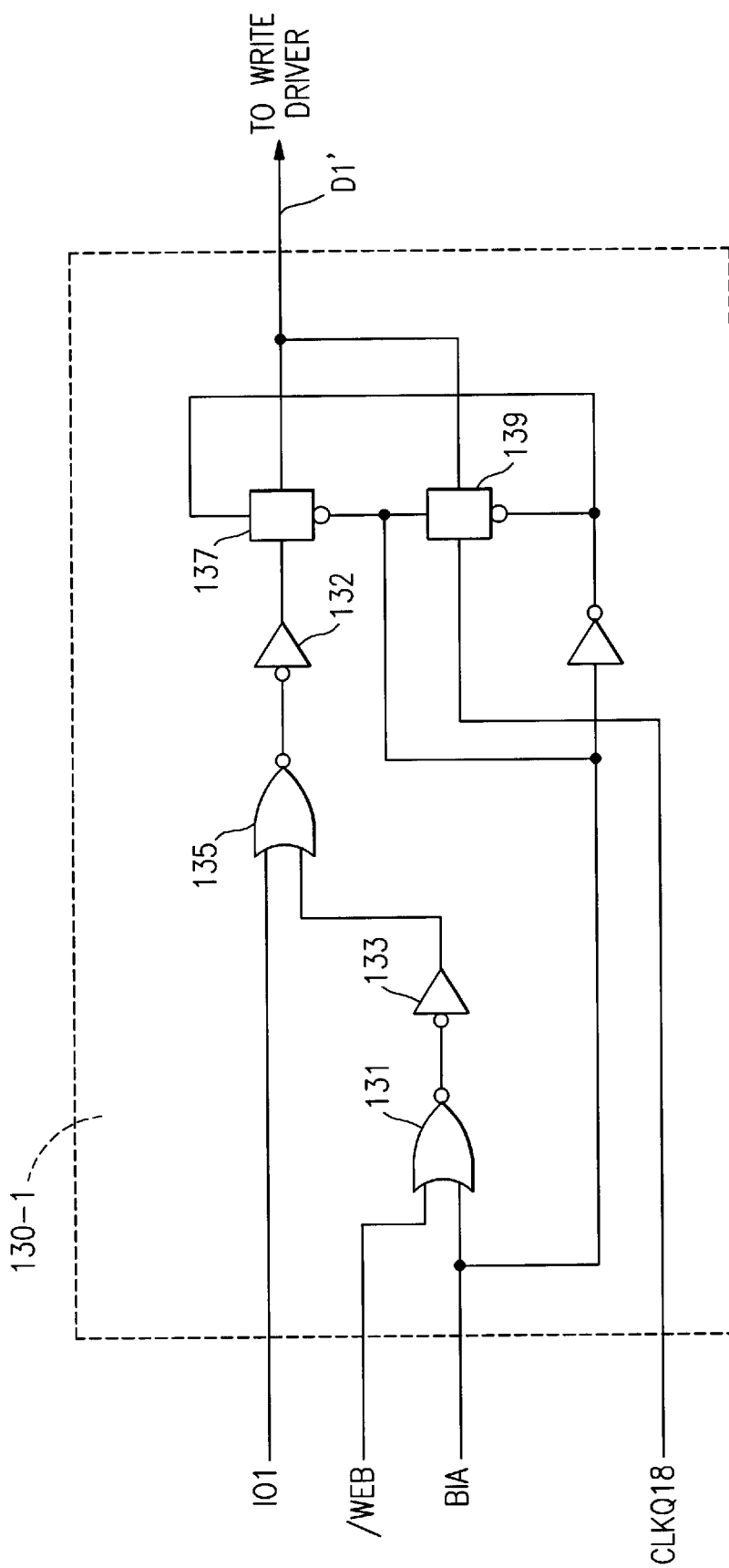
FIG. 6 shows a circuit diagram of a data signal input circuit of the SRAM chip in accordance with an embodiment of the present invention.

Next, the data signal input circuit will be described in detail, using the data signal input circuit 130-1 as an example. FIG. 6 shows a circuit diagram of the data signal input circuit 130-1. During the normal operation, the /write enable signal (/WE) is an L level (active), the burn-in mode signal is at an L level (non-active), and the XWEB signal becomes an L level. A signal at an H level output from a NOR gate 131 is inverted by an inverter 133 to become a signal at an L level, and then input in a NOR gate 135. Also, by the BIA signal at an L level, a transfer gate 137 is turned ON. Accordingly, an external address signal input through the terminal IO1 is inverted by the NOR gate 135, inverted by the inverter 132, transferred through the transfer gate 137, and output as a data D0' signal of to the write driver 300.

On the other hand, during a burn-in mode, the burn-in mode signal becomes an H level (active), and a signal CLKQ 18 from an output terminal Q18 of the T flip-flop 120-18 is input in the data signal input circuit 130-1. By the BIA signal at an H level, the transfer gate 139 is turned ON. By this, the signal CLKQ18 passes through the transfer gate 139, and is output as a data D1' signal to the write driver 300. It is noted that, by the BIA signal at an H level, the transfer gate 137 is turned OFF, and therefore an input from the terminal IO0 is prohibited. Also, by the BIA signal at an H level, a signal at an L level output from the NOR gate 131 is inverted by the inverter 133 to become a signal at an H level, and input in the NOR gate 135. As a result, the current that flows to the NOR gate 135 is shut out.

The above is a detail of the data signal input circuit 130-1. The data signal input circuits 130-2–130-16 have a structure similar to that of the data signal input circuit 130-1.

Burn-in Mode

A burn-in process for tho SRAM chip 1000 will be described. In FIG. 2, the burn-in mode terminal BI is provided with an H level to start a burn-in mode. At this moment, since an output BIA of the burn-in control signal input circuit 103 becomes an H level, inputs to the NOR gates 102-1–102-3 in the control signal input circuit are prohibited. However, an XCSA signal becomes an L level (active) to place the chip in an enable state, and since an XWEA signal is at an L level (active), and an XOER signal is at an H level (non-active), the SRAM chip 1000 is placed in a write state.

One of the features of the present embodiment is address generation and data writing in a burn-in mode. This feature will be described with reference to FIG. 1. During a burn-in mode, based on counting of a clock signal from outside by the counter (F flip-flops 120-0–120-17), address A0' signal—address A18' signal are generated. By decoding the address A0' signal—address A18' signal by the row decoder 201 and the column decoder 202 (see FIG. 2), corresponding addresses of the memory cells MC that form the memory cell array 500 (see FIG. 3) are selected. Based on the signal CLKQ18 from the output terminal Q18 of the T flip-flop 120-18, data D1' signal—data D16' signal are generated. The data D1' signal—data D16' signal are written by the write driver 300 in the selected memory cells MC to thereby conduct the burn-in.

Figure 7:
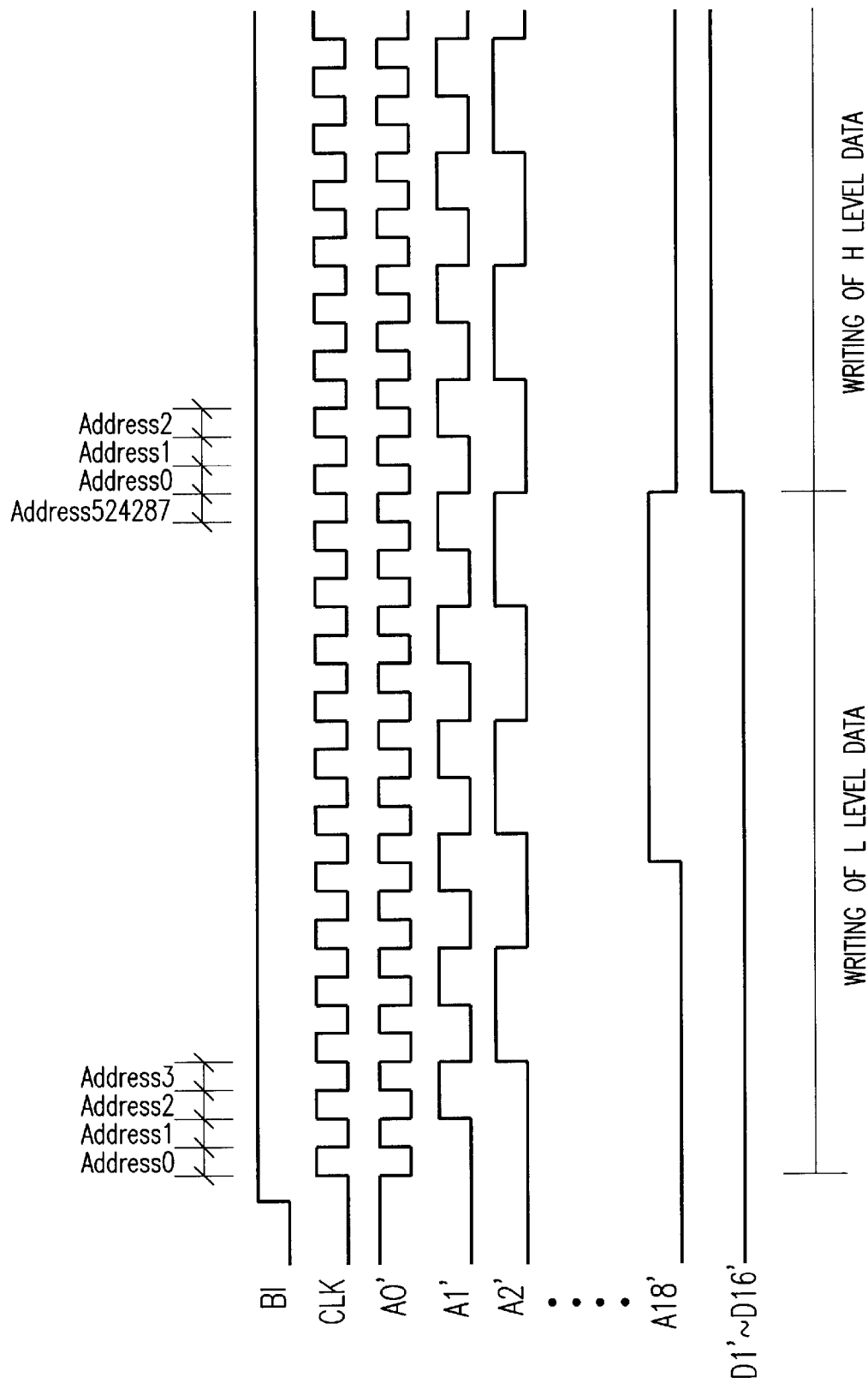
FIG. 7 shows a timing chart indicating timings of generating addresses in a burn-in mode for the SRAM chip in accordance with an embodiment of the present invention.

Next, the burn-in step for the SRAM chip 1000 will be described using a timing chart. FIG. 7 shows a timing chart of the burn-in mode for the SRAM chip 1000. When the burn-in mode signal (BI) becomes an H level (active), a burn-in mode is started. When the burn-in mode is started, at the first rise E1 of the external clock signal CLK, address (A0', A1', A2', . . . , and A18') signals become (L, L, L, . . . , and L) levels, and a memory cell MC at address 0 is selected. At a next fall E2, address (A0', A1', A2', . . . , and A18') signals become (H, L, . . . , and L), and a memory cell MC at address 1 is selected. At a next rise E3, address (A0', A1', A2', . . . , and A18') signals become (L, H, L, . . . , and L), and a memory cell MC at address 2 is selected. In a similar manner, addresses are serially selected, and finally a memory cell MC at address 524278 is selected. Since the data D1' signal—data D16' signal are at an L level, data at an L level are written in each of the memory cells MC.

After the memory cell MC at address 524278 is selected, the memory cell at address 0 is selected again, and selection operations are serially conducted until the memory cell MC at address 524278 is selected. Since the data D1' signal—data D16' signal are at an H level, data at an H level is written in each of the memory cells MC.

It is understood from the above description that the address signal input circuits 110-0–110-18, the T flip-flops 120-0–120-17 and the inverter 140 compose the address signal generation section. The data signal input circuits 130-1–130-16 and the T flip-flop 120-18 compose the data signal generation section.

Main effects of the present embodiment will be described. In accordance with the present embodiment, address terminals, data input terminals, and control terminals become unnecessary in a burn-in process, such that these terminals can be prevented from damages. Accordingly, the present embodiment can improve the yield in manufacturing SRAMs.

Also, in accordance with the present embodiment, since addresses are serially generated based on counting of a clock signal, a complex address signal generation circuit is not required.

Also, in accordance with the present embodiment, terminals used for a burn-in test, which are the BI terminal 600-1 the CLK terminal 600-2, the VDDBI terminal 600-4, and the VSSBI terminal 600-3 are exclusively for burn-in. Accordingly, even when they are damaged due to, for example, contacts with the probe needles in a burn-in test, the use of the SRAM chip 1000 is not affected.

Also, as described above, in accordance with the present embodiment, the burn-in is conducted while inputs of address signals and data signals from outside and inputs of control signals are prohibited. As a result, even when these input terminals are open, a through current is prevented from flowing through the input NOR gates. Accordingly, correct current consumption on many chips can be measured even during a burn-in test, and chips that develop current failure due to occurrence of defects in the burn-in tests can be rejected.

Also, in accordance with the present embodiment, a signal from the output terminal Q17 of the last stage of the flip-flops (T flip-flop 120-17) of the counter (T flip-flops 12-0–120-17) is input in the clock input terminal of the T flip-flop 120-18. Then, signals, which are created by dividing the signal CLKQ18 of the output terminal Q17, are output from the output terminal Q18 of the T flip-flop 120-18, and are used as the data D1' signal—data D16' signal. By this, data D1' signal—data D16' signal at an L level are first written in each of the memory cells MC, and then data D1' signal—data D16' signal at an H level are written in each of the memory cells MC. As a result, since stresses art L level and H level are applied to each of the memory cells MC, efficient stresses can be applied to each of the memory cells MC. It is noted that data D1' signal—data D16' signal at an H level may be written first in each of the memory cells MC, and then data D1' signal—data D16' signal at an L level may written in each of the memory cells MC, which results in similar effects.

Release of Automatic Power Down

Figure 8:
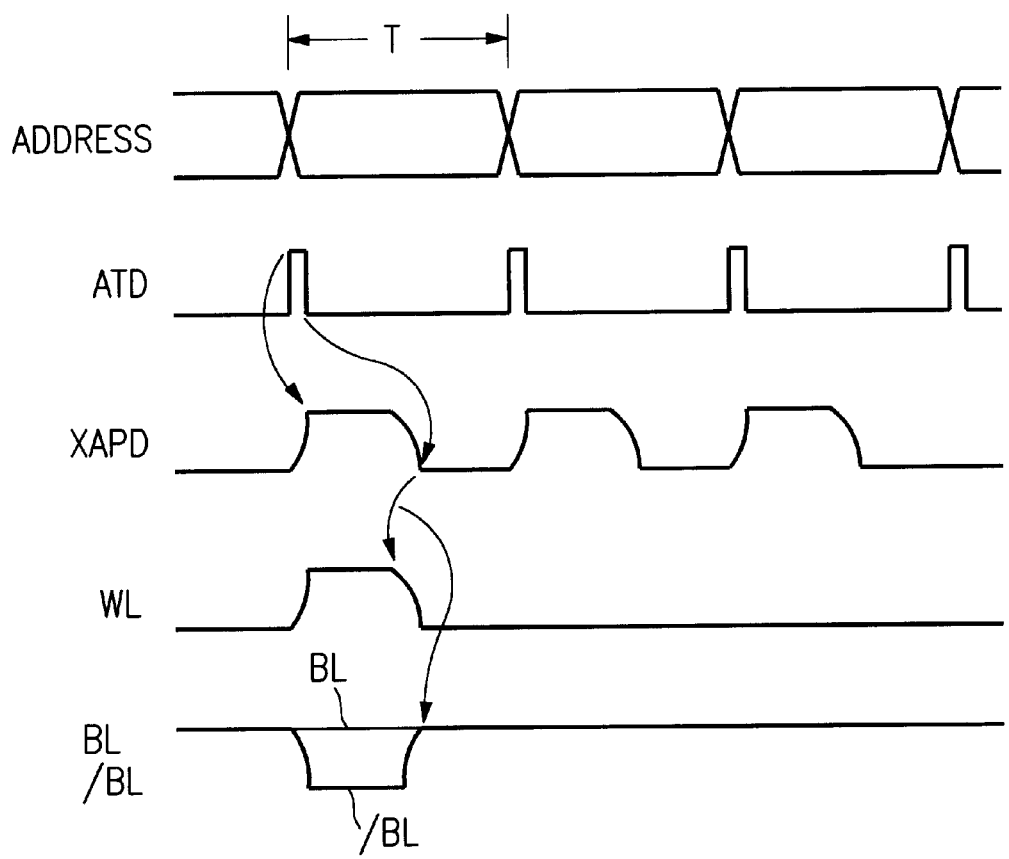
FIG. 8 shows a timing chart that illustrates an ordinary automatic power down.

In the present embodiment, since the burn-in is conducted while the automatic power down is released, the time for burn-in can be shortened. Details thereof will be described below. FIG. 8 shows a timing chart of the automatic power down. "T" indicates a minimum cycle time. The minimum cycle time T is a minimum time required between a time when a group of address signals (e.g., address A0' signal—address A18' signal in the present embodiment) change and a time when the next address change takes place according to the specification. The automatic power down is a function to automatically terminate a selection period for word line and bit line pair earlier than the minimum cycle time T. Since writing to and reading from a memory cell are normally finished earlier than the minimum cycle time T, it would be a waste of power to continue selecting the word line and bit line pair during the remaining time in the cycle time T. Accordingly, when the time for writing in or reading from a memory cell has passed, the automatic power down stops selecting the word line and bit line pair.

An ATD signal is a pulse signal that is created by mixing by the ATP mixing circuit 150 shown in FIG. 1 the pulse signals ATP0–ATP18 that are generated each time the address signal changes, as described above with reference to FIG. 5. The ADT signal functions as triggers for a series of operations performed when reading from or writing in memory cells, in other words, for controlling in selecting word lines, selecting bit line pain, and reading or writing of data signals.

When an XAPD signal (automatic power down signal) is at an L level, the word line and bit line pair are non-selected.

Since, at a rise of the ATD signal, the XAPD signal becomes an H level, the word line and bit line pair can be selected. After a fall of the ATD signal, an automatic power down timer operates, such that the XAPD signal becomes an L level after a predetermined time has elapsed. By this operation, the word line and bit line pair become non-selected, and the non-selected bit line pair is precharged to the power supply potential.

Figure 9:
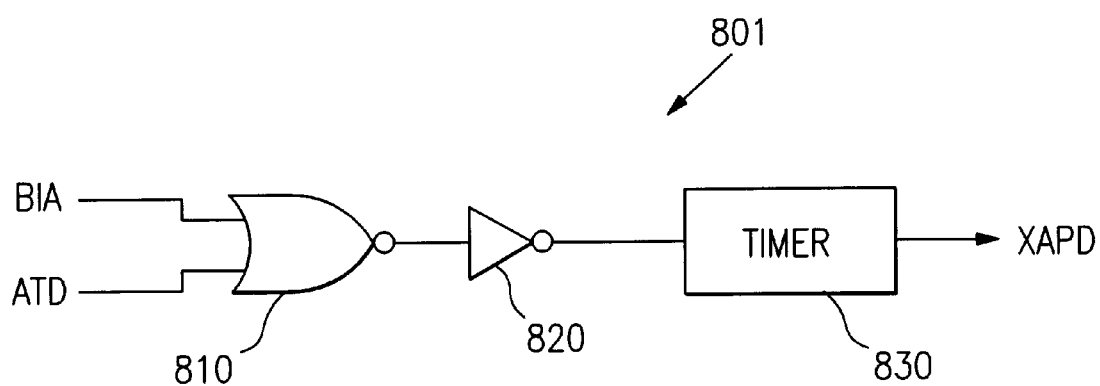
FIG. 9 shows a block diagram of a control section for an automatic power down signal (XAPD) in accordance with an embodiment of the present invention.

FIG. 9 shows a block diagram of an XAPD signal control section 801 in accordance with the present embodiment. The XAPD signal control section 801 is formed in the timing control circuit 800 shown in FIG. 2. During the normal operation, the burn-in mode signal (BIA) is at an L level, and therefore the ATD signal pulse is input in a NOR gate 810 and then a timer 830 through an inverter 820. While the ATD signal is at an H level, the timer 830 is reset, and a /APD signal at an H level is output. Accordingly, the word line and bit line pair can be selected. When the ATD signal falls, the timer 830 operates, such that the XAPD signal becomes an L level after a specified time has elapsed (for example, 40 ns against the minimum cycle time 100 ns) after writing in or reading from a memory cell is completed. By this, selection of the word line and bit line pair is completed.

On the other hand, during the burn-in mode, the BIA signal is at an H level, and the automatic power down is released, such that the timer 830 continues to output the XAPD signal at an H level. Accordingly, the word line and bit pair line can be selected. It is appreciated from the description above that the XAPD signal control section 801 shown in FIG. 9 includes a device that releases the function to terminate the selection period for word line and bit line pair earlier than the cycle time base on the burn-in mode signal.

Figure 10:
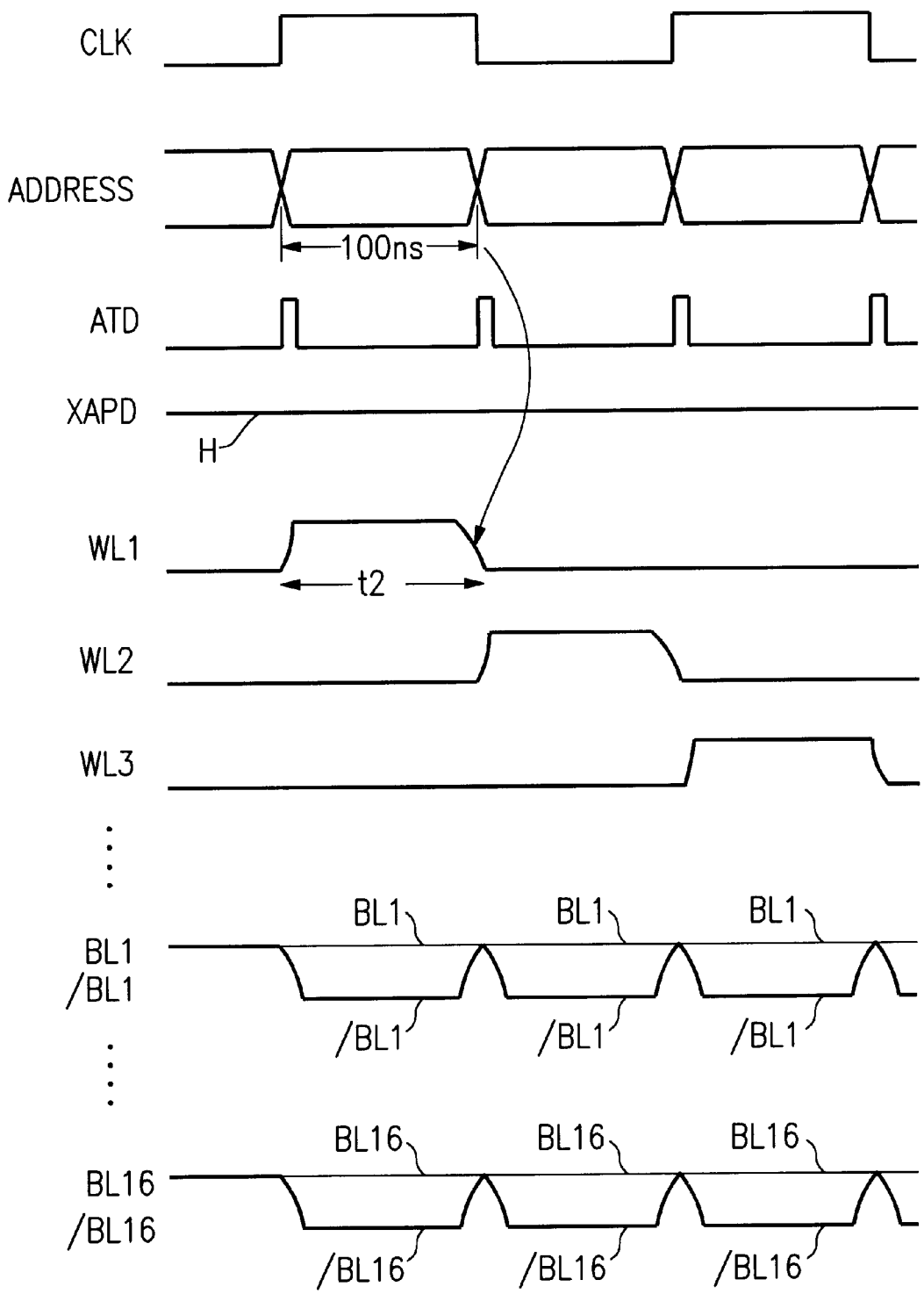
FIG. 10 shows a timing chart of a burn-in operation that is conducted while releasing the automatic power down in the SRAM chip in accordance with an embodiment of the present invention.

FIG. 10 shows a timing chart of the burn-in mode in accordance with the present embodiment. Each time the external clock (CLK) signal changes, the address A0' signal—address A18' signal change, such that addresses change. This operation was described above with reference to FIG. 7. Accordingly, in the present embodiment, a half cycle of the clock (CLK) signal is an address cycle time (for example, 100 ns). In the present embodiment, since the automatic power down is released, the XAPD signal remains to be at an H level. Therefore, selection of the word line and bit line pair continues until the next address change, such that a selection period t2 is extended longer than that in the normal operation.

In a manner described above, in accordance with the present embodiment, selected memory cells are subject to stresses for a longer period of time than in the normal operation. For this reason, the time for burn-in can be shortened.

Figure 11:
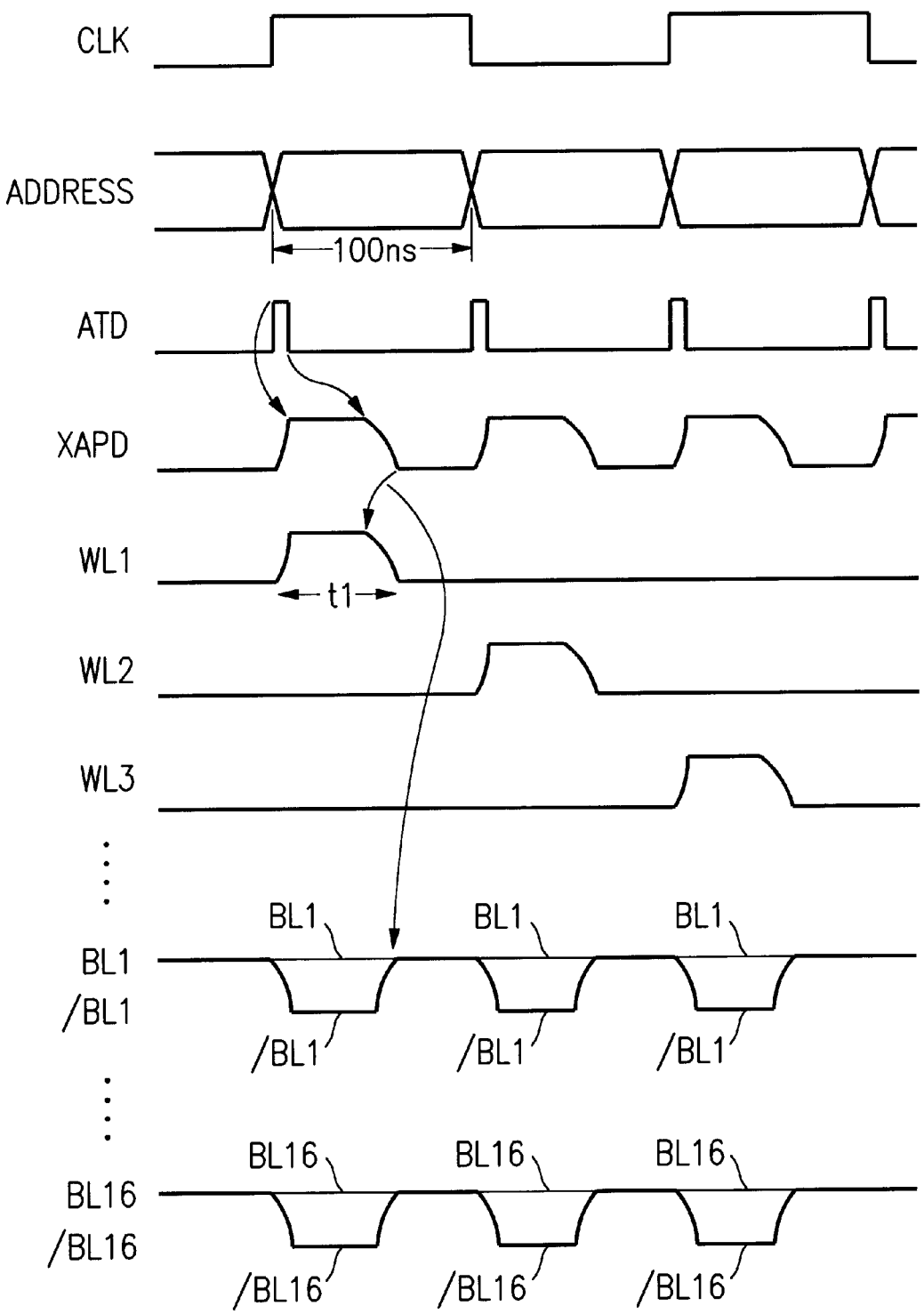
FIG. 11 shows a timing chart of a burn-in operation that is conducted without releasing the automatic power down in the SRAM chip in accordance with an embodiment of the present invention.

It is noted that, in the present invention, the burn-in can be conducted without releasing the automatic power down. In this case, as shown in FIG. 11, due to the automatic power down, a selection period (t1) for the word line and bit line pair becomes shorter than the address cycle time (for example, 100 ns).

Embodiments of Burn-in

Figure 12:
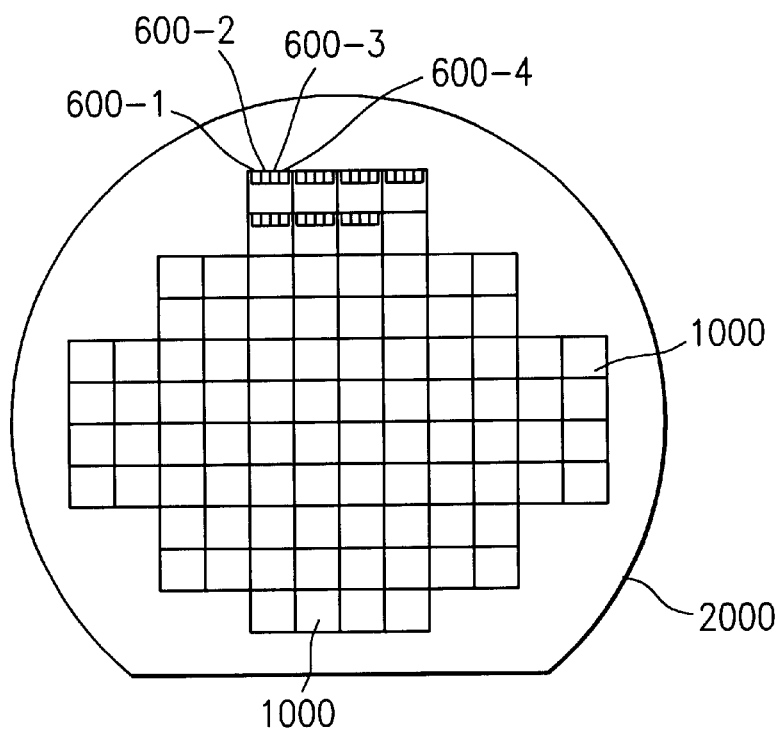
FIG. 12 shows a plan view of a semiconductor wafer on which many SRAM chips in accordance with the present embodiment are formed.
Figure 13:
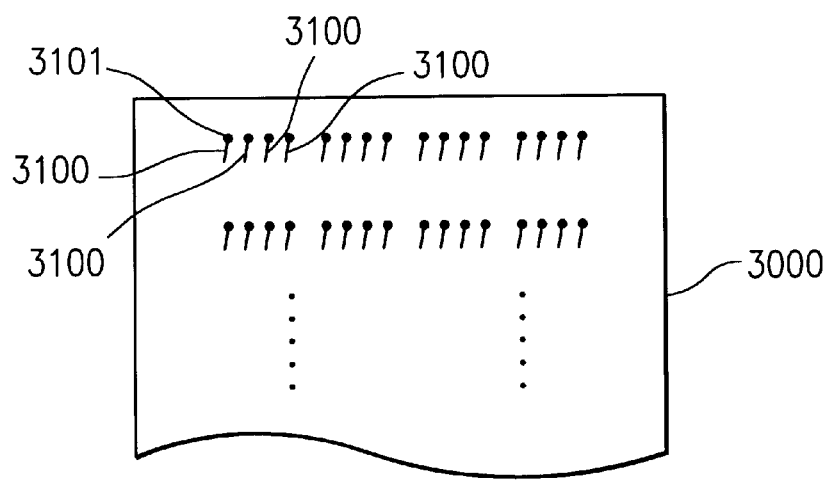
FIG. 13 shows a plan view in part of a probe card that is used for burn-in of a semiconductor wafer on which many SRAM chips in accordance with the present embodiment are formed.

An example of a semiconductor wafer and a probe that are used for a wafer-level burn-in process in accordance with the present embodiments will be described. FIG. 12 shows a plan view of a semiconductor wafer 2000. Numerous SRAM chips 1000 are formed in the semiconductor wafer 2000. FIG. 13 shows a plan view in part of a probe card that is used for burn-in of the semiconductor wafer 2000. The probe card 3000 is provided with numerous needles 3100 provided at through holes 3101 formed therein. The numerous through holes 3101 are wired to terminals (not shown) provided on the probe card 3000, and connected a burn-in apparatus (not shown) through the terminals. Each four of the needles 3100 form one set. When a wafer-level burn-in is conducted, each one set of the needles 3100 is used for each of the SRAM chips 1000, and brought in contact with the pads 600-1–600-4. In other words, in accordance with the present embodiment, four terminals, i.e., the VDDBI terminal, VSSBI terminal, BI terminal and CLK terminal, are used for burn-in, and thus only four probe needles are used for burn-in of each of the SRAM chips 1000. The number of terminals that can be used for burn-in is determined by the system structure of the burn-in apparatus. Also, there is a limitation in the number of needles that can be connected on a probe card. In accordance with the present embodiment, the number of terminals that are brought in contact with the probe needles 3100 in burn-in can be reduced, and therefore, when a burn-in test is conducted at a wafer-level, the number of chips that can be subject to the burn-in test can be increased. In other words, the time required for burn-in of each wafer can be shortened.

What is claimed is:

1. A semiconductor memory including a plurality of memory cells comprising:

a first terminal that becomes a power supply terminal for the semiconductor memory;

a second terminal that becomes a ground terminal for the semiconductor memory;

a third terminal for inputting a burn-in mode signal to place the semiconductor memory in a burn-in mode;

a fourth terminal for inputting an external clock signal;

an address signal generation section that generates an address signal for selecting each of the plurality of memory cells based on counting of the clock signal while the burn-in mode signal is input;

a data signal generation section that generates a data signal based on the clock signal while the burn-in mode signal is input; and a data writing section that writes data of the data signal in the memory cells selected by the address signal.

2. The semiconductor memory according to claim 1, wherein
the first terminal, the second terminal, the third terminal and the fourth terminal are exclusively used in the burn-in mode, and further comprising:
a fifth terminal that is different from the first terminal and becomes a power supply terminal for the semiconductor memory, and
a sixth terminal that is different from the second terminal and becomes a ground terminal for the semiconductor memory.

3. The semiconductor memory according to claim 1, wherein the address signal generation section includes a counter, wherein an output from the counter is the address signal.

4. The semiconductor memory according to claim 3, wherein the data signal generation section is equipped with a signal divider that divides an output signal from a flip-flop at the last stage of the counter, and generates the data signal based on a signal output from the signal divider.

5. The semiconductor memory according to claim 1, further comprising a device that releases a function to terminate a selection period for a word line and a bit line pair earlier than a cycle time, based on the burn-in mode signal.

6. The semiconductor memory according to claim 1, further comprising:
an address signal input circuit at which an external address signal is input, and
a data signal input circuit at which an external data signal is input,
wherein the address signal input circuit prohibits input of the external address signal by the burn-in mode signal, and
the data signal input circuit prohibits input of the external data signal by the burn-in mode signal.

7. The semiconductor memory according to claim 1, wherein the power supply terminal is a VDD terminal.

8. The semiconductor memory according to claim 1, wherein the ground terminal is a VSS terminal.

9. The semiconductor memory according to claim 1, wherein addresses are generated in series.

10. The semiconductor memory according to claim 5, wherein the function to terminate the selection period of a word line and a bit line pair earlier than the cycle time also lowers power consumption.

11. A burn-in method for a semiconductor memory including a plurality of memory cells comprising:
placing the semiconductor memory in a burn-in mode;
supplying a potential to the semiconductor memory;
generating an address for each of the plurality of memory cells based on counting of an external clock signal during the burn-in mode;
generating data based on the clock signal during the burn-in mode; and
writing the data in the memory cells corresponding to the addresses, wherein writing the data is conducted while releasing a function to terminate a selection period for a word line and a bit line pair earlier than a cycle time.

12. The burn-in method for a semiconductor memory according to claim 11, wherein writing the data writes a first level in the plurality of memory cells, and then writes a second level therein.

13. The burn-in method for a semiconductor memory according to claim 11, further comprising:
prohibiting input of external address and data during the burn-in mode.

14. The burn-in method for a semiconductor memory according to claim 11, further comprising:
conducting the burn-in mode at a wafer-level.

15. The burn-in method for a semiconductor memory according to claim 11, further comprising:
generating a burn-in mode signal during the burn in mode.

16. The burn-in method for a semiconductor memory according to claim 15, further comprising:
releasing a function to terminate a selection period for a word line and a bit line pair earlier than a cycle time, based on the burn-in mode signal.

17. The burn-in method for a semiconductor memory according to claim 11, wherein generating data includes dividing an output signal from a flip-flop at the last stage of a counter, and generating the data signal based on a signal output from the divided output signal.

18. The burn-in method for a semiconductor memory according to claim 11, further comprising:
grounding the semiconductor device.

19. A semiconductor memory including a plurality of memory cells comprising:
a power supply terminal for the semiconductor memory;
a ground terminal for the semiconductor memory;
means for inputting a burn-in mode signal to place the semiconductor memory in a burn-in mode;

means for inputting an external clock signal;

means for generating an address signal that selects each of the plurality of memory cells based on counting of the clock signal while the burn-in mode signal is input;

means for generating a data signal based on the clock signal while the burn-in mode signal is input; and means for writing data of the data signal in the memory cells selected by the address signal.

20. The semiconductor memory according to claim 19, wherein the power supply terminal, the ground terminal, the means for inputting a burn-in mode signal and the means for inputting an external clock signal are exclusively used for burn-in mode, and further comprising a fifth terminal that is different from the power supply terminal and becomes a second power supply terminal for the semiconductor memory, and a sixth terminal that is different from the ground terminal and becomes a second ground terminal for the semiconductor memory.

21. The semiconductor memory according to claim 19, wherein the means for generating includes a counter, wherein an output from the counter is the address signal.

22. The semiconductor memory according to claim 21, wherein the means for generating a data signal is equipped with a signal divider that divides an output signal from a flip-flop at the last stage of the counter, and generates the data signal based on a signal output from the signal divider.

23. The semiconductor memory according to claim 19, further comprising:

a device that releases a function to terminate a selection period for a word line and a bit line pair earlier than a cycle time, based on the burn-in mode signal.

24. The semiconductor memory according to claim 19, further comprising:

an address signal input circuit at which an external address signal is input, and a data signal input circuit at which an external data signal is input, wherein the address signal input circuit prohibits input of the external address signal by the burn-in mode signal, and the data signal input circuit prohibits input of the external data signal by the burn-in mode signal.

25. The semiconductor memory according to claim 19, wherein the power supply terminal is a VDD terminal.

26. The semiconductor memory according to claim 19, wherein the ground terminal is a VSS terminal.

27. The semiconductor memory according to claim 19, wherein addresses are generated in series.

28. The semiconductor memory according to claim 23, wherein the function to terminate the selection period of a word line and a bit line pair earlier than the cycle time also lowers power consumption.

29. A semiconductor memory including a plurality of memory cells, comprising:

means for placing the semiconductor memory in a burn-in mode;

means for supplying a potential to the semiconductor memory;

means for generating an address for each of the plurality of memory cells based on counting of an external clock signal during the burn-in mode;

means for generating data based on the clock signal during the burn-in mode; and means for writing the data in the memory cells corresponding to the addresses, wherein writing the data is conducted while releasing a function to terminate a selection period for a word line and a bit line pair earlier than a cycle time.

30. A semiconductor memory according to claim 29, wherein the means for writing the data writes a first level in the plurality of memory cells, and then writes a second level therein.

31. A semiconductor memory according to claim 29, further comprising:

means for prohibiting input of external address and data during the burn-in mode.

32. A semiconductor memory according to claim 29, further comprising:

means for conducting the burn-in mode at a wafer-level.

33. A semiconductor memory according to claim 29, further comprising:

means for generating a burn-in mode signal during the burn in mode.

34. A semiconductor memory according to claim 33, further comprising:

means for releasing a function to terminate a selection period for a word line and a bit line pair earlier than a cycle time, based on the burn-in mode signal.

35. A semiconductor memory according to claim 29, wherein the means for generating data includes:

means for dividing an output signal from a flip-flop at the last stage of a counter, and means for generating the data signal based on a signal output from the divided output signal.

36. A semiconductor memory according to claim 29, further comprising:

means for grounding the semiconductor device.

37. A semiconductor memory including a plurality of memory cells comprising:

a first terminal that becomes a power supply terminal of the semiconductor memory;

a second terminal that becomes a ground terminal for the semiconductor memory;

a third terminal for inputting a burn-in mode signal to place the semiconductor memory in a burn-in mode;

a fourth terminal for inputting an external clock signal;

an address signal generation section that generates an address signal for selecting each of the plurality of memory cells based on counting of the clock signal while the burn-in mode signal is input;

a data signal generation section that generates a data signal based on the clock signal while the burn-in mode signal is input;

a data writing section that writes data of the data signal in the memory cells selected by the address signal; and a device that releases a function to terminate a selection period for a word line and a bit line pair earlier than a cycle time, based on the burn-in mode signal.

38. The semiconductor memory according to claim 37, wherein the first terminal, the second terminal, the third terminal and the fourth terminal are exclusively used for burn-in mode, and further comprising:

a fifth terminal that is different from the first terminal and becomes a power supply terminal for the semiconductor memory, and a sixth terminal that is different from the second terminal and becomes a ground terminal for the semiconductor memory.

39. The semiconductor memory according to claim 37, wherein the address signal generation section includes a counter, wherein an output from the counter is the address signal.

40. The semiconductor memory according to claim 39, wherein the data signal generation section is equipped with a signal divider that divides an output signal from a flip-flop at the last state of the counter, and generates the data signal based on a signal output from the signal divider.

41. The semiconductor memory according to claim 37, further comprising:
an address signal input circuit at which an external address signal is input, and
a data signal input circuit at which an external data signal is input,
wherein the address signal input circuit prohibits input of the external address signal by the burn-in mode signal, and
the data signal input circuit prohibits input of the external data signal by the burn-in mode signal.

42. The semiconductor memory according to claim 37, wherein the power supply terminal is a VDD terminal.

43. The semiconductor memory according to claim 37, wherein the ground terminal is a VSS terminal.

44. The semiconductor memory according to claim 37, wherein addresses are generated in series.

45. The semiconductor memory according to claim 44, wherein the function to terminate the selection period of a word line and a bit line pair earlier than the cycle time also lowers power consumption.

46. A semiconductor memory including a plurality of memory cells comprising:
a first terminal that becomes a power supply terminal for the semiconductor memory;
a second terminal that becomes a ground terminal for the semiconductor memory;
a third terminal for inputting a burn-in mode signal to place the semiconductor memory in a burn-in mode;
a fourth terminal for inputting an external clock signal;
an address signal generation section a that generates an address signal for selecting each of the plurality of memory cells based on counting of the clock signal while the burn-in mode signal is input;
a data signal generation section that generates a data signal based on the clock signal while the burn-in mode signal is input;
a data writing section that writes data of the data signal in the memory cells selected by the address signal;
an address signal input circuit at which an external address signal is input; and
a data signal input circuit at which an external data signal is input,
wherein the address signal input circuit prohibits input of the external address signal by the burn-in mode signal, and
the data signal input circuit prohibits input of the external data signal by the burn-in mode signal.

47. The semiconductor memory according to claim 46, wherein
the first terminal, the second terminal, the third terminal and the fourth terminal are exclusively used for burn-in mode, and further comprising:
a fifth terminal that is different from the first terminal and becomes a power supply terminal for the semiconductor memory, and
a sixth terminal that is different from the second terminal and becomes a ground terminal for the semiconductor memory.

48. The semiconductor memory according to claim 46, wherein the address signal generation section includes a counter, wherein an output from the counter is the address signal.

49. The semiconductor memory according to claim 46, wherein the data signal generation section is equipped with a signal divider that divides an output signal from a flip-flop at the last stage for the counter, and generates the data signal based on a signal output from the signal divider.

50. The semiconductor memory according to claim 46, further comprising:
a device that releases a function to terminate a selection period for a word line and a bit line pair earlier than a cycle time, based on the burn-in mode signal.

51. The semiconductor memory according to claim 46, wherein the power supply terminal is a VDD terminal.

52. The semiconductor memory according to claim 46, wherein the ground terminal is a VSS terminal.

53. The semiconductor memory according to claim 46, wherein addresses are generated in series.

54. The semiconductor memory according to claim 53, wherein the function to terminate the selection period of a word line and a bit line pair earlier than the cycle time also lowers power consumption.

55. A semiconductor memory including a plurality of memory cells comprising:
a first terminal that becomes a power supply terminal of the semiconductor memory;
a second terminal that becomes a ground terminal for the semiconductor memory;
a third terminal for inputting a burn-in mode signal to place the semiconductor memory in a burn-in mode;
a fourth terminal for inputting an external clock signal;
an address signal generation section that generates an address signal for selecting each of the plurality of memory cells based on counting of the clock signal while the burn-in mode signal is input, wherein addresses are generated in series;
a data signal generation section that generates a data signal based on the clock signal while the burn-in mode signal is input; and
a data writing section that writes data of the data signal in the memory cells selected by the address signal.

56. The semiconductor memory according to claim 55, wherein
the first terminal, the second terminal, the third terminal and the fourth terminal are exclusively used for burn-in mode, and further comprising:
a fifth terminal that is different from the first terminal and becomes a power supply terminal for the semiconductor memory, and
a sixth terminal that is different from the second terminal and becomes a ground terminal for the semiconductor memory.

57. The semiconductor memory according to claim 55, wherein the address signal generation section includes a counter, wherein an output from the counter is the address signal.

58. The semiconductor memory according to claim 57, wherein the data signal generation section is equipped with a signal divider that divides an output signal from a flip-flop at the last stage of the counter, and generates the data signal based on a signal output from the signal divider.

59. The semiconductor memory according to claim 55, further comprising:
a device that releases a function to terminate a selection period for a word line and a bit line pair earlier than a cycle time, based on the burn-in mode signal.

60. The semiconductor memory according to claim 58, further comprising:
an address signal input circuit at which an external address signal is input, and
a data signal input circuit at which an external data signal is input, wherein the address signal input circuit prohibits input of the external address signal by the burn-in mode signal, and the data signal input circuit prohibits input of the external data signal by the burn-in mode signal.

61. The semiconductor memory according to claim 55, wherein the power supply terminal is a VDD terminal.

62. The semiconductor memory according to claim 55, wherein the ground terminal is a VSS terminal.

63. The semiconductor memory according to claim 59, wherein the function to terminate the selection period of a word line and a bit line pair earlier than the cycle time also lowers power consumption.

* * * * *

UNITED STATES PATENT AND TRADEMARK OFFICE
CERTIFICATE OF CORRECTION

PATENT NO.    : 6,594,186 B2
DATED         : July 15, 2003
INVENTOR(S)   : Kodaira et al.

It is certified that error appears in the above-identified patent and that said Letters Patent is hereby corrected as shown below:

<u>Title page,</u>
Item [73], Assignee: change "Saiko Epson Corporation" to -- Seiko Epson Corporation --.

Signed and Sealed this

Thirteenth Day of April, 2004

JON W. DUDAS
*Acting Director of the United States Patent and Trademark Office*